(12) United States Patent
Zhu et al.

(10) Patent No.: US 8,624,285 B2
(45) Date of Patent: *Jan. 7, 2014

(54) LIGHT EMITTING DIODE WITH THREE-DIMENSIONAL NANO-STRUCTURES

(75) Inventors: Zhen-Dong Zhu, Beijing (CN); Qun-Qing Li, Beijing (CN); Li-Hui Zhang, Beijing (CN); Mo Chen, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/479,225

(22) Filed: May 23, 2012

(65) Prior Publication Data

US 2013/0140595 A1    Jun. 6, 2013

(30) Foreign Application Priority Data

Dec. 3, 2011   (CN) .......................... 2011 1 0395477

(51) Int. Cl.
*H01L 33/00*   (2010.01)

(52) U.S. Cl.
USPC ........... 257/98; 257/99; 257/E33.074; 257/13

(58) Field of Classification Search
USPC ........ 257/13, E33.008, 98, E33.074; 977/950
See application file for complete search history.

(56) References Cited

U.S. PATENT DOCUMENTS

2008/0042153 A1* 2/2008 Beeson et al. .................. 257/94
2013/0140519 A1* 6/2013 Zhu et al. ........................ 257/13

* cited by examiner

*Primary Examiner* — Bilkis Jahan
(74) *Attorney, Agent, or Firm* — Altis Law Group, Inc.

(57) ABSTRACT

A light emitting diode including a first semiconductor layer, an active layer, and a second semiconductor layer is provided. The first semiconductor layer includes a first surface and a second surface. The active layer and the second semiconductor layer are stacked on the second surface in that order, and a surface of the second semiconductor layer away from the active layer is configured as the light emitting surface. A first electrode is electrically connected with and covers the first surface of the first semiconductor layer. A second electrode is electrically connected with the second semiconductor layer. A number of three-dimensional nano-structures are located on the surface of the first surface of the first semiconductor layer and the light emitting surface, and a cross section of each of the three-dimensional nano-structure is M-shaped.

12 Claims, 9 Drawing Sheets

US 8,624,285 B2

LIGHT EMITTING DIODE WITH THREE-DIMENSIONAL NANO-STRUCTURES

CROSS-REFERENCE TO RELATED APPLICATIONS

This application claims all benefits accruing under 35 U.S.C. §119 from China Patent Application No. 201110395473.2, filed on Dec. 3, 2011 in the China Intellectual Property Office, disclosure of which is incorporated herein by reference. This application is related to applications entitled, "LIGHT EMITTING DIODE", filed May 23, 2012 (Ser. No. 13/479,223); "LIGHT EMITTING DIODE", filed May 23, 2012 (Ser. No. 13/479,227); "METHOD FOR MAKING LIGHT EMITTING DIODE", filed May 23, 2012 (Ser. No. 13/479,229); "LIGHT EMITTING DIODE", filed May 23, 2012 (Ser. No. 13/479,230); "METHOD FOR MAKING LIGHT EMITTING DIODE", filed May 23, 2012 (Ser. No. 13/479,232); "LIGHT EMITTING DIODE", filed May 23, 2012 (Ser. No. 13/479,233); "METHOD FOR MAKING LIGHT EMITTING DIODE", filed May 23, 2012 (Ser. No. 13/479,234); "LIGHT EMITTING DIODE", filed May 22, 2012 (Ser. No. 13/477,273).

BACKGROUND

1. Technical Field

The present disclosure relates to a light emitting diode (LED).

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. LEDs also generate less heat. Therefore, LED modules are widely used as light sources in optical imaging systems, such as displays, projectors, and so on.

LEDs include an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light.

However, the extraction efficiency of LEDs is low because the contact area between the N-type semiconductor layer and the active layer is not large enough. Thus the electron-hole recombination density is low, and the photons in the LED are sparse, thereby degrading the extraction efficiency.

What is needed, therefore, is a light emitting diode which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
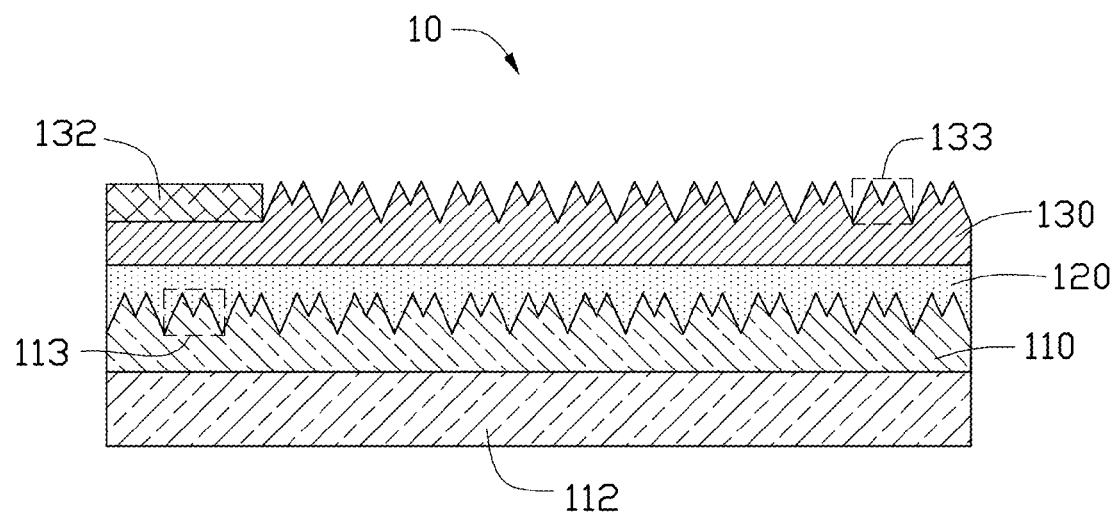
FIG. 1 shows a schematic view of one embodiment of an LED.

Referring to FIG. 1, one embodiment of an LED 10 includes a first semiconductor layer 110, an active layer 120, a second semiconductor layer 130, a first electrode 112, and a second electrode 132. The first semiconductor layer 110 includes a first surface and a second surface opposite to the first surface. The active layer 120 and the second semiconductor layer 130 are stacked on the second surface of the first semiconductor layer 110 in that order. The surface of the second semiconductor layer 120 away from the active layer 120 is configured as the light emitting surface of LED 10. The second surface of the first semiconductor layer 110 defines a plurality of three-dimensional nano-structures 113. The light emitting surface of LED 10 defines a plurality of three-dimensional nano structures 133. The first electrode 112 is electrically connected with and covers the first surface of the first semiconductor layer 110, and the second electrode 132 is electrically connected with the second semiconductor layer 130.

The first semiconductor layer 110 is an N-type semiconductor or a P-type semiconductor. The material of the N-type semiconductor can include N-type gallium nitride, N-type gallium arsenide, or N-type copper phosphate. The material of the P-type semiconductor can include P-type gallium nitride, P-type gallium arsenide, or P-type copper phosphate. The N-type semiconductor is configured to provide electrons, and the P-type semiconductor is configured to provide holes. The thickness of the first semiconductor layer 110 ranges from about 1 μm to about 5 μm. In one embodiment, the first semiconductor layer 110 is an N-type gallium nitride doped with Si. The first semiconductor layer 110 includes a first surface and a second surface opposite to the first surface. The first surface contacts the first electrode 112. The active layer 120 and the second semiconductor layer 130 are stacked on the second surface.

In one embodiment, a buffer layer (not shown) can be sandwiched between the substrate and the first semiconductor layer 110. Because the first semiconductor layer 110 and the substrate have different lattice constants, the buffer layer is used to reduce the lattice mismatch, thus the dislocation density of the first semiconductor layer 110 will decrease. The thickness of the buffer layer ranges from about 10 nanometers to about 300 nanometers, and the material of the buffer layer can be GaN or AlN.

Figure 2:
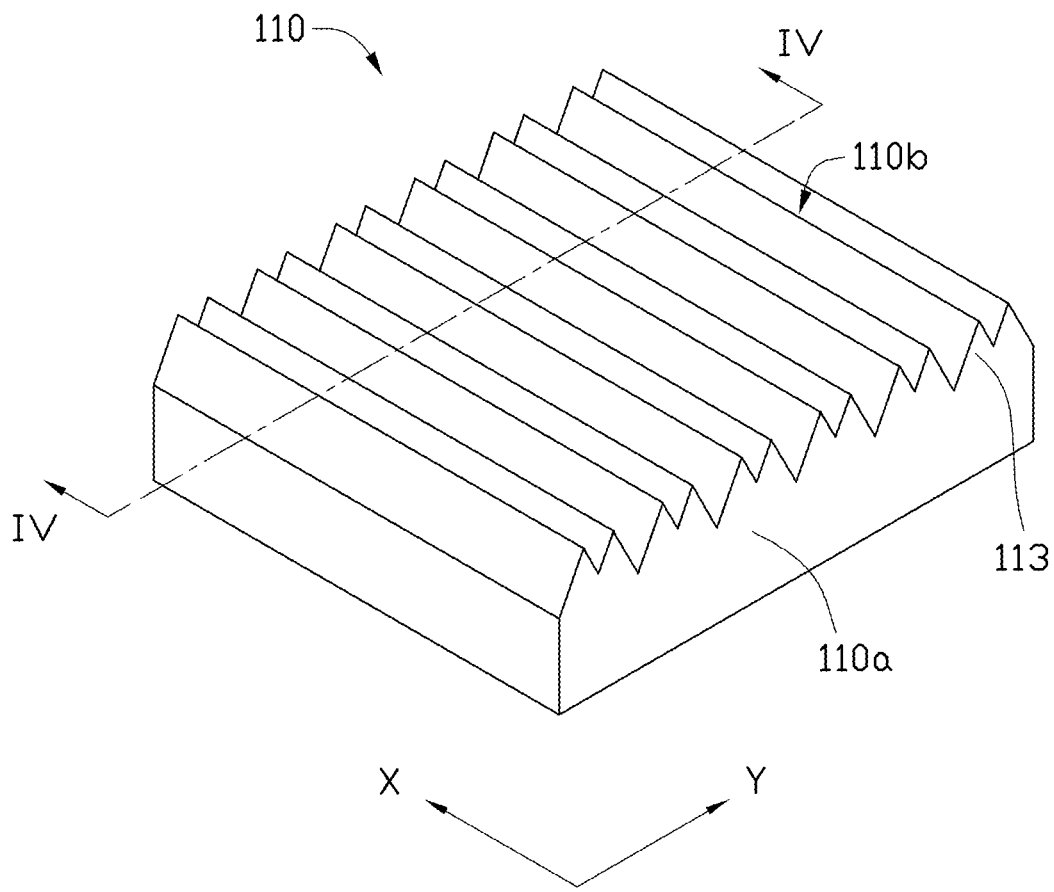
FIG. 2 is an isometric view of one embodiment of a three-dimensional nano-structures array in the LED of FIG. 1.

Referring to FIG. 1 and FIG. 2, the second surface of the first semiconductor layer 110 is a patterned surface. The first semiconductor layer 110 can be separated into a main body 110a and a protruding part 110b and distinguished by an "interface." The interface can be substantially parallel with the first surface of the first semiconductor layer 110. The interface is defined as a surface of the main body 110a hereafter, and the protruding part 110b extends away from the surface of the main body 110a. The protruding part 110b defines the plurality of three-dimensional nano-structures 113, and the plurality of three-dimensional nano-structures 113 form the patterned surface of the first semiconductor layer 110. The three-dimensional nano-structure 113 can be a protruding structure. The protruding structure protrudes out from the interface of the main body 110a. The plurality of three-dimensional nano-structures 113 is a protruding structure located on the surface of the main body 110a.

Figure 3:
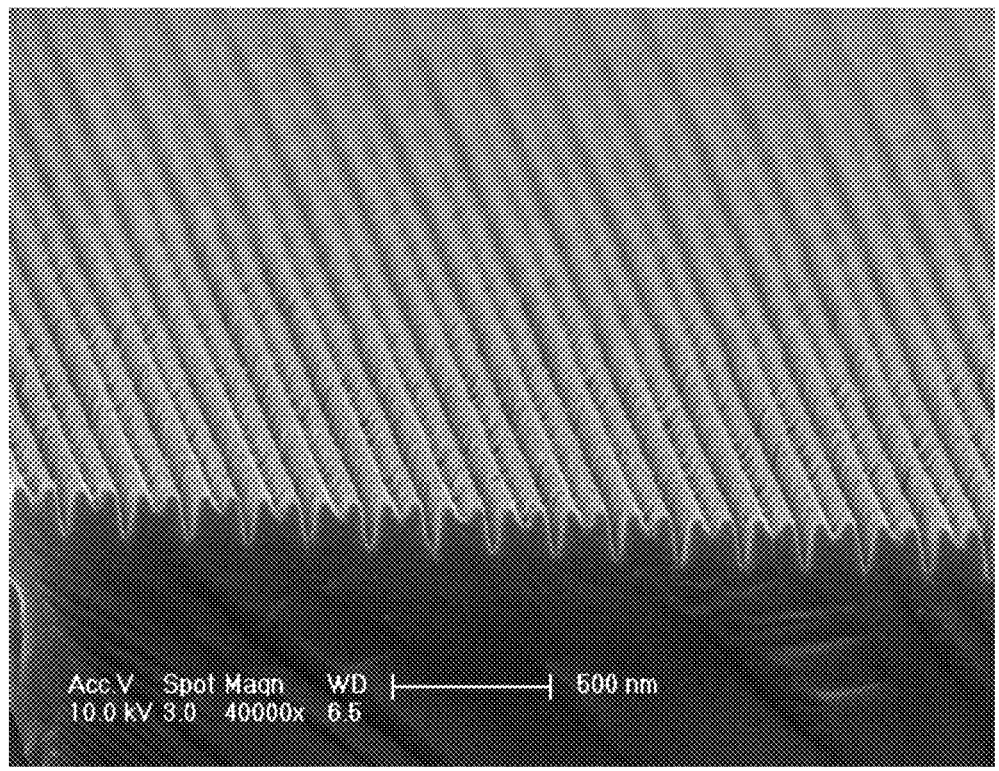
FIG. 3 shows a scanning electron microscope (SEM) image of the three-dimensional nano-structures array of FIG. 2.

The plurality of three-dimensional nano-structures 113 can be arranged side by side. Each of the three-dimensional nano-structures 113 can extend along a straight line, a curvy line, or a polygonal line. The extending direction is substantially parallel with the surface of the first semiconductor layer 110. The two adjacent three-dimensional nano-structures are arranged a certain distance apart from each other. The distance ranges from about 0 nanometers to about 1000 nanometers, such as 10 nanometers, 30 nanometers or 200 nanometers. The extending direction of the three-dimensional nano-structure 113 can be fixed or varied. While the extending direction of the three-dimensional nano-structure 113 is fixed, the plurality of three-dimensional nano-structures 113 extends along a straight line, otherwise the three-dimensional nano-structures 113 extends along a polygonal line or a curvy line. The cross-section of the three-dimensional nano-structure 113 along the extending direction is M-shaped. Referring to FIG. 3, the three-dimensional nano-structures 113 are a plurality of substantially parallel bar-shaped protruding structures extending along a straight line. The plurality of three-dimensional nano-structures 113 are substantially uniformly and equidistantly distributed on the entire surface of the main body 110a.

Figure 4:
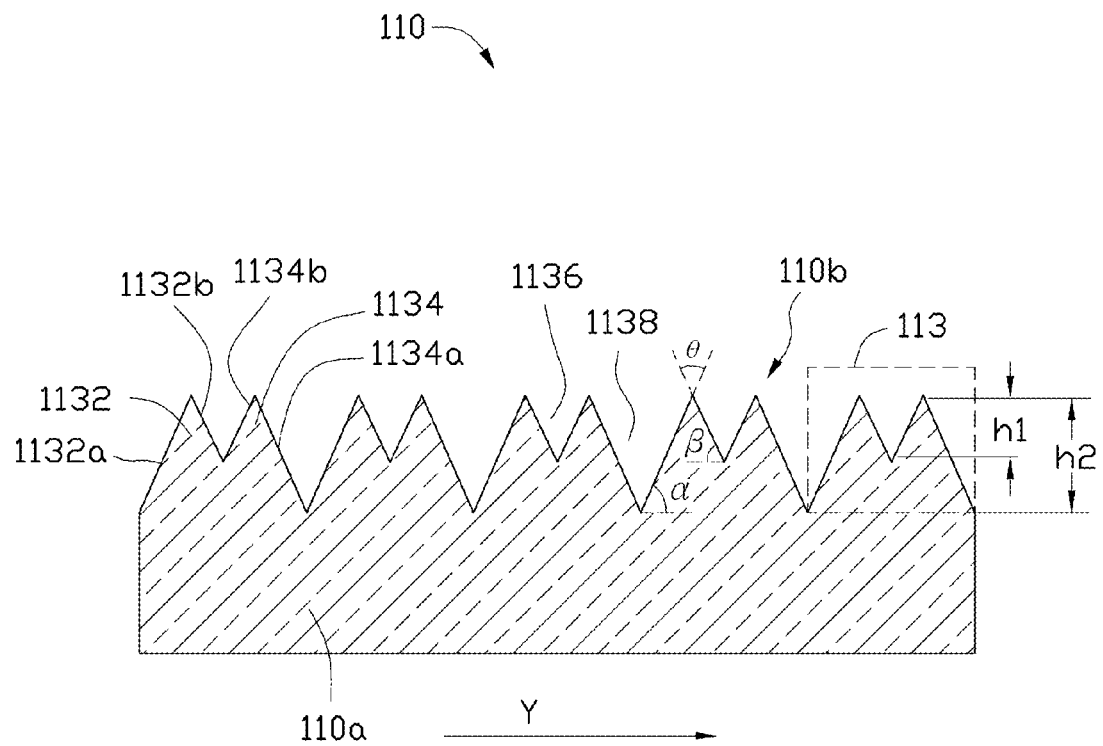
FIG. 4 shows cross-sectional view along a line IV-IV of FIG. 2.

Also referring to FIG. 4, the three-dimensional nano-structure 113 extends from one side of the semiconductor layer 110 to the opposite side along the X direction. The Y direction is substantially perpendicular to the X direction and substantially parallel with the surface of the main body 110a. The three-dimensional nano-structure 113 is a double-peak structure including two peaks. The cross-section of the double-peak structure is M-shaped. The first peak 1132 and the second peak 1134 extend substantially along the X direction. The first peak 1132 includes a first surface 1132a and a second surface 1132b. The first surface 1132a and the second surface 1132b intersect to form an intersection line and an included angle θ of the first peak 1132. The intersection line can be a straight line, a curvy line, or a polygonal line. The included angle θ is greater than 0 degree and smaller than 180 degrees. In one embodiment, the included angle θ ranges from about 30 degrees to about 90 degrees. The first surface 1132a and the second surface 1132b can be planar, curvy, or wrinkly. In one embodiment, the first surface 1132a and the second surface 1132b are planar. The first surface 1132a is intersected with the surface of the main body 110a at an angle α. The angle α is greater than 0 degrees and less than or equal to 90 degrees. In one embodiment, the angle α is greater than 80 degrees and less than 90 degrees. The first surface 1132a includes a side connected to the surface of the substrate, and extends away from the main body 110a to intersect with the second surface 1132b. The second surface 1132b includes a side connected with the second peak 1134 and extends away from the main body 110a at an angle β. The angle β is greater than 0 degrees and smaller than 90 degrees.

The second peak 1134 includes a third surface 1134a and a fourth surface 1134b. The structure of the second peak 1134 is substantially the same as that of the first peak 1132. The third surface 1134a and the fourth surface 1134b intersect each other to form the included angle of the second peak 1134. The third surface 1134a includes a side intersecting the surface of the main body 110a and extends away from the main body 110a to intersect the fourth surface 1134b. The fourth surface 1134b includes a side intersecting the third surface 1134a to form the included angle of the second peak 1134, and extends to intersect the second surface 1132b of the first peak 1132 to define a first groove 1136. A second groove 1138 is defined between two adjacent three-dimensional nano-structures 113. The second groove 1138 is defined by the third surface 1134a of the second peak 1134 and the first surface 1132a of the first peak 1132 of the adjacent three-dimensional nano-structure 113.

The first peak 1132 and the second peak 1134 protrude out of the main body 110a. The height of the first peak 1132 and the second peak 1134 is arbitrary and can be selected according to need. In one embodiment, both the height of the first peak 1132 and that of the second peak 1134 range from about 150 nanometers to about 200 nanometers. The height of the first peak 1132 can be substantially equal to that of the second peak 1134. The highest points of the first peak 1132 and the second peak 1134 are defined as the farthest point away from the surface of the main body 110a. In one three-dimensional nano-structure 113, the highest point of the first peak 1132 is spaced from that of the second peak 1134 a certain distance ranging from about 20 nanometers to about 100 nanometers. The first peak 1132 and the second peak 1134 extend substantially along the X direction. The cross-section of the first peak 1132 and the second peak 1134 can be trapezoidal or triangular, and the shape of the first peak 1132 and the second peak 1134 can be substantially the same. In one embodiment, the cross-sections of the first peak 1132 and the second peak 1134 are triangular. In one embodiment, the first peak 1132, the second peak 1134, and the main body 110a form an integrated structure. Because of the limitation of the technology, the first surface 1132a and the second surface 1132b cannot be absolutely planar.

In each M-shaped three-dimensional nano-structure 113, the first peak 1132 and the second peak 1134 define the first groove 1136. The extending direction of the first groove 1136 is substantially the same as the extending direction of the first peak 1132 and the second peak 1134. The cross-section of the first groove 1136 is V-shaped. The depth $h_1$ of the first groove 1136 in different three-dimensional nano-structures 113 is substantially the same. The depth $h_1$ is defined as the distance between the highest point of the first peak 1132 and the lowest point of the first groove 1136. The depth $h_1$ of the first groove 1136 is less than the height of the first peak 1132 and the second peak 1134.

The second groove 1138 extends substantially along the extending direction of the three-dimensional nano-structures 113. The cross-section of the second groove 1138 is V-shaped or an inverse trapezium. Along the extending direction, the cross-section of the second groove 1138 is substantially the same. The depth $h_2$ of the second grooves 1138 between each two adjacent three-dimensional nano-structures 113 is substantially the same. The depth $h_2$ is defined as the distance between the highest point and the lowest point of the groove of the second groove 1138. The depth $h_2$ of the second groove 1138 is greater than the depth $h_1$ of the first groove 1136, and the ratio between $h_1$ and $h_2$ ranges from about 1:1.2 to about 1:3 ($1:1.2 \leq h_1:h_2 \leq 1:3$). The depth of the first groove 1136 ranges from about 30 nanometers to about 120 nanometers, and the depth of the second groove 1138 ranges from about 90 nanometers to about 200 nanometers. In one embodiment, the depth of the first groove 1136 is about 80 nanometers, and the depth of the second groove 1138 is about 180 nanometers. The depth of the first groove 1136 and the second groove 1138 can be selected according to need.

The width of the three-dimensional nano-structure 113 ranges from about 100 nanometers to about 200 nanometers. The width of the three-dimensional nano-structure 113 is defined as the maximum span of the three-dimensional nano-structure 113 along the Y direction. The span of the three-dimensional nano-structure 113 is gradually decreased along the direction away from the main body 110a. Thus in each three-dimensional nano-structure 113, the distance between the highest point of the first peak 1132 and the highest point of the second peak 1134 is less than the width of the three-dimensional nano-structure 113. The plurality of three-dimensional nano-structures 113 can be distributed in a certain interval from each other, and the intervals can be substantially the same. The interval forms the second groove 1138. The distance 4 between the two adjacent three-dimensional nano-structures 113 ranges from about 0 nanometers to about 200 nanometers. The distance between each two adjacent three-dimensional nano-structures 113 can be substantially the same. The distance 4 can be increased with the increase of the height of both the first peak 1132 and second peak 1134, and decreased with the decrease of the height of both the first 1132 and second peaks 1134. In the Y direction, the distance $\lambda_0$ can be increased, decreased, or periodically varied. If the distance $\lambda_0=0$, the cross-section of the second groove 1138 is V-shaped. If the distance $\lambda_0>0$, the cross-section of the second groove 1138 is in the shape of an inverse trapezium.

Along the Y direction, the plurality of three-dimensional nano-structures 113 is distributed in a certain period P. One period P is defined as the width $\lambda$ of the three-dimensional nano-structures 113 added with the distance $\lambda_0$. The period P of the plurality of three-dimensional nano-structures 113 can range from about 100 nanometers to about 500 nanometers. The period P, the width $\lambda$, and the distance $\lambda_0$ satisfy the following formula: $P+\lambda+\lambda_0$. The period P, the width $\lambda$, and the distance $\lambda_0$ is measured in nanometers. The period P can be a constant, and $\lambda_0$ or $\lambda$ can be a dependent variable. Furthermore, one part of the three-dimensional nano-structures 113 can be aligned in a first period, and another part of the three-dimensional nano-structures 113 can be aligned in a second period.

In one embodiment, the period P is about 200 nanometers, the width $\lambda$ is about 190 nanometers, and the distance $\lambda_0$ is about 10 nanometers.

The active layer 120 is located on the second surface of the first semiconductor layer 110. In one embodiment, the active layer 120 covers the entire surface of the first region. The active layer 120 is engaged with the first semiconductor layer 110. In detail, the active layer 120 covers the plurality of three-dimensional nano-structures 113, and the surface of the active layer 120 connected with the first semiconductor layer 110 forms a patterned surface. The active layer 120 also includes a plurality of grooves and peaks, the grooves being engaged with the first peaks 1132 and second peaks 1134, the peaks being engaged with the first grooves 1136 and second grooves 1138. The active layer 120 is a photon excitation layer and can be one of a single layer quantum well film or multilayer quantum well films. The active layer 120 is made of GaInN, AlGaInN, GaSn, AlGaSn, GaInP, or GaInSn. In one embodiment, the active layer 120 has a thickness of about 0.3 μm and includes one layer of GaInN and another layer of GaN. The GaInN layer is stacked with the GaN layer.

Figure 5:
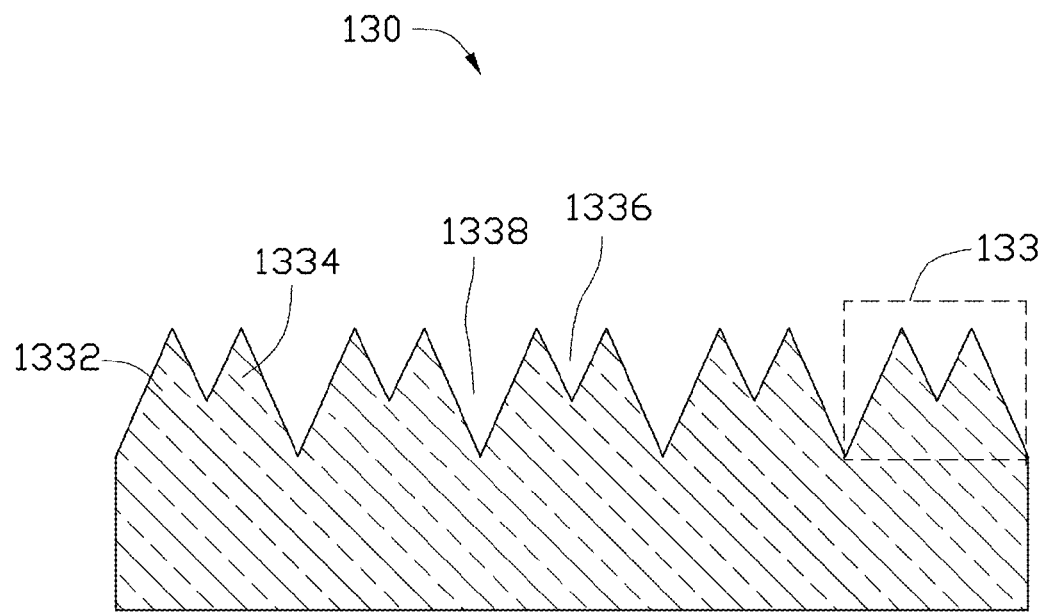
FIG. 5 shows a schematic view of the second semiconductor layer of FIG. 1.

Referring to FIG. 5, the second semiconductor layer 130 is located on the active layer 120. The surface of the second semiconductor layer 130 away from the active layer 120 is configured as the light emitting surface of the LED 10. In one embodiment, the second semiconductor layer 130 covers the entire surface of the active layer 120 away from the substrate. The thickness of the second semiconductor layer 130 ranges from about 0.1 μm to about 3 μm. The second semiconductor layer 130 can be an N-type semiconductor layer or a P-type semiconductor layer. Furthermore, the type of the second semiconductor layer 130 is different from the type of the first semiconductor layer 110. In one embodiment the second semiconductor layer 130 is a P-type gallium nitride doped with Mg. Furthermore, the light emitting surface of the LED 10 defines the plurality of three-dimensional nano-structures 133 to form a patterned surface. The structure of the three-dimensional nano-structures 133 is same as the structure of the three-dimensional nano-structures 113. The three-dimensional nano-structure 133 is a protruding structure extending away from the second semiconductor layer 130. The plurality of three-dimensional nano-structures 133 can be arranged side by side. The extending direction of the three-dimensional nanostructures 133 can be fixed or varied. The cross-section of the three-dimensional nanostructure 133 along the extending direction is M-shaped. Each M-shaped three-dimensional nano-structure 133 includes a first peak 1332 and a second peak 1334 extending along the same direction. A first groove 1336 is defined between the first peak 1332 and the second peak 1334. A second groove 1338 is defined between the two adjacent three-dimensional nano-structures 133. The depth of the first groove 1336 is smaller than the depth of the second groove 1338.

The first electrode 112 is electrically connected with and covers the first surface of the first semiconductor layer 110. The first electrode 112 is a single layer structure or a multi-layer structure. The first electrode 112 can also be used as the reflector of the LEDs to reflect the photons. The first electrode 112 can be an N-type electrode or a P-type electrode according to the first semiconductor layer 110. The material of the first electrode 112 can be Ti, Ag, Al, Ni, Au, or any combination of them. The material of the first electrode 112 can also be indium-tin oxide (ITO) or carbon nanotube film. In one embodiment, the first electrode 112 is a two-layer structure consisted of a Ti layer with about 15 nm in thickness and an Au layer with about 100 nm in thickness.

The second electrode 132 can be an N-type electrode or P-type electrode. In one embodiment, the second electrode 132 is located on the light emitting surface of LED 10. In detail, the second electrode 132 covers at least part of the three-dimensional nano-structures 133. The type of the second electrode 132 is the same as the second semiconductor layer 130. The shape of the second electrode 132 is arbitrary and can be selected according to need. The second electrode 132 covers a part of the surface or the entire surface of the second semiconductor layer 130. The material of the second electrode 132 can be Ti, Ag, Al, Ni, Au, or any combination of them.

Furthermore, a reflector layer (not shown) can be sandwiched between the first semiconductor layer 110 and the first electrode 112. The material of the reflector can be Ti, Ag, Al, Ni, Au, or any combination thereof. The reflector includes a smooth surface having a high reflectivity. The photons reach the reflector and will be reflected by the reflector, thus these photons can be extracted out of the LED 10 to improve the light extraction efficiency of the LED 10.

The first semiconductor layer 110 includes a plurality of three-dimensional nano-structures to form a patterned surface, and the active layer 120 is located on the patterned surface, thus the contact area between the first semiconductor layer 110 and the active layer 120 is enlarged. The electron-hole recombination density is improved, and the quantity of photons is increased. The light extraction efficiency of the LED 10 can be improved.

One embodiment of a method for making the LED 10 includes the following steps:

S11, providing a substrate (not shown) with an epitaxial growth surface;

S12, growing a first semiconductor layer 110 on the epitaxial growth surface;

S13, forming a plurality of three-dimensional nano-structures 113 on the first semiconductor layer 110;

S14, growing an active layer 120 and a second semiconductor layer 130 on the surface of the plurality of three-dimensional nano-structures 113 in that order;

S15, forming a plurality of three-dimensional nano-structures 133 by etching the surface of the second semiconductor layer 130 away from the active layer 120;

S16, removing the substrate to expose a surface of the first semiconductor layer 110;

S17, applying a first electrode 112 electrically connected to and covering the exposed surface of the first semiconductor layer 110; and S18, locating a second electrode 132 electrically connected to the second semiconductor layer 130.

Figure 6:
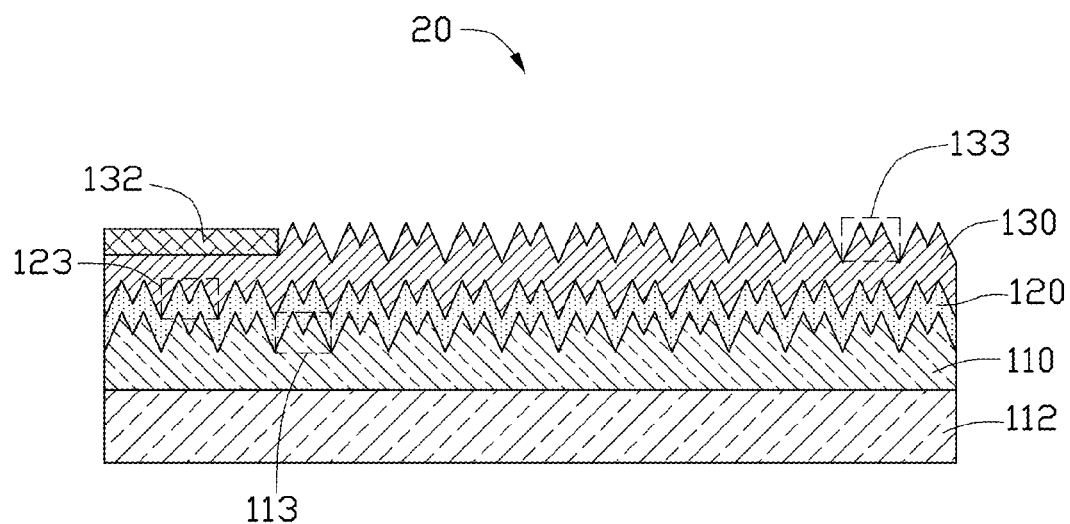
FIG. 6 shows a schematic view of another embodiment of an LED.

Referring to FIG. 6, another embodiment of an LED 20 includes a first semiconductor layer 110, an active layer 120, a second semiconductor layer 130, a first electrode 112, and a second electrode 132. The first semiconductor layer 110 includes a first surface and an opposite second surface. The first surface is in contact with the first electrode 112. The active layer 120 and the second semiconductor layer 130 are stacked on the second surface, and in that order. The surface of the second semiconductor layer 130 away from the active layer 120 is configured as the light emitting surface of the LED 10. The second surface of the first semiconductor layer defines a plurality of three-dimensional nano-structures 113. The surface of the active layer 120 away from the first semiconductor layer 110 defines a plurality of three-dimensional nano-structures 123. The light emitting surface of the LED 10 defines a plurality of three-dimensional nano-structures 133. The first electrode 112 is electrically connected with the first semiconductor layer 110, and the second electrode 132 is electrically connected with the second semiconductor layer 130. The plurality of three-dimensional nano-structures 123 is located on the surface of the active layer 120 away from the first semiconductor layer 110. The structure of the LED 20 is similar to that of the LED 10, but further includes the plurality of three-dimensional nano-structures 123 located on the active layer 120 away form the first semiconductor layer 110.

Figure 7:
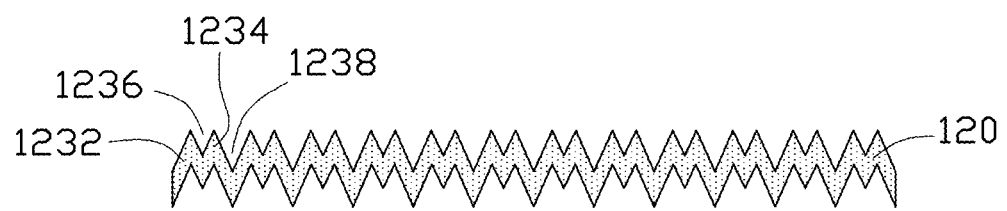
FIG. 7 shows a schematic view of the active layer of FIG. 6.

Referring to FIG. 7, the plurality of three-dimensional nano-structures 123 forms a patterned surface on the active layer 120. The three-dimensional nano-structure 123 is similar to the three-dimensional nano-structures 113. Each three-dimensional nano-structure 123 includes a first peak 1232 and a second peak 1234, a first groove 1236 defined between the first peak 1232 and the second peak 1234, and a second groove 1238 defined between two adjacent three-dimensional nano-structures 123. The distribution and alignment of the three-dimensional nano-structures 123 is the same as the distribution and alignment of the three-dimensional nano-structures 113. The second semiconductor layer 130 is located on the surface of the three-dimensional nano-structures 113, thus the surface of the second semiconductor layer 130 near the active layer 120 forms a patterned surface.

In the LED 20, the surface of the active layer in contact with the second semiconductor layer also includes a plurality of three-dimensional nano-structures, thus the contact area between the second semiconductor layer and the active layer is also enlarged. The electron-hole recombination density is further increased, and the light extraction efficiency of the LED 20 can be improved.

One embodiment of a method for making the LED 20 includes the following steps:

S21, providing a substrate (now shown) having an epitaxial growth surface;

S22, growing a first semiconductor layer 110;

S23, forming a plurality of three-dimensional nano-structures 113 on a surface of the semiconductor layer 110;

S24, growing an active layer 120 on the surface of the three-dimensional nano-structures 113, and forming a plurality of three-dimensional nano-structures 123 on the surface away from the first semiconductor layer 110;

S25, growing a second semiconductor layer 130 on the surface of the three-dimensional nano-structures 123;

S26, forming a plurality of three-dimensional nano-structures 133 on the surface of the semiconductor layer 130;

S28, removing the substrate to exposed a surface of the first semiconductor layer 110; and S29, applying a first electrode 112 on the exposed surface of the first semiconductor layer 110, and applying a second electrode 132 electrically connected to the second semiconductor layer 130.

The method of making the LED 20 is similar to the method for making the LED 10, except that the LED 20 further forms the plurality of three-dimensional nano-structures 123 on the surface of the active layer 120 away from the first semiconductor layer 110. The substrate with the first semiconductor layer 110 is located in a vertical epitaxial growth reactor, and the active layer 120 grows by a vertical epitaxial growth method. Thus the distribution and alignment of the three-dimensional nano-structure 123 is the same as the distribution and alignment of the three-dimensional nano-structure 113.

Figure 8:
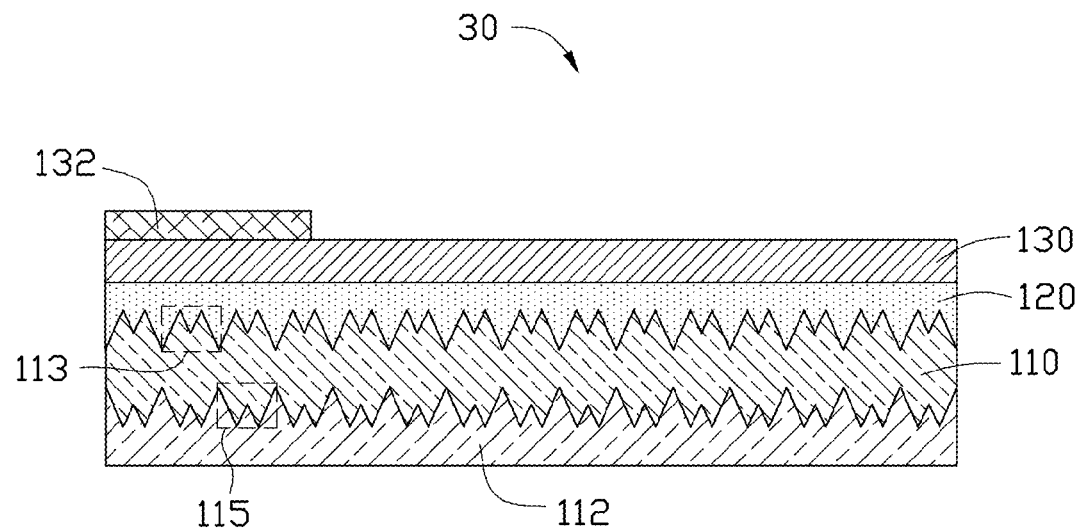
FIG. 8 shows a schematic view of another embodiment of an LED.

Referring to FIG. 8, another embodiment of an LED 30 includes a first semiconductor layer 110, an active layer 120, a second semiconductor layer 130, a first electrode 112, and a second electrode 132. The first semiconductor layer 110 includes a first surface and a second surface opposite to the first surface. The active layer 120 and the second semiconductor layer 130 are stacked on the second surface of the first semiconductor layer 110 in that order. The surface of the second semiconductor layer 120 away from the active layer 120 is configured as the light emitting surface of LED 30. The second surface of the first semiconductor layer 110 defines a plurality of three-dimensional nano-structures 113. The first surface of the first semiconductor layer 110 defines a plurality of three-dimensional nano-structures 115. The first electrode 112 is electrically connected with and covers the plurality of the three-dimensional nano-structures 115. The second electrode 132 is electrically connected with the second semiconductor layer 130. The structure of the LED 30 is similar to that of the LED 10, but further includes the plurality of three-dimensional nano-structures 115 located on the first surface of the first semiconductor layer 110.

The plurality of three-dimensional nano-structures 115 forms a patterned surface. The three-dimensional nano-structure 115 is similar to the three-dimensional nano-structures 113. The distribution and alignment of the three-dimensional nano-structures 115 is the same as that of the three-dimensional nano-structures 113.

One embodiment of a method for making the LED 30 includes the following steps:

S31, providing a substrate;

S32, growing a first semiconductor layer 110 on the substrate;

S33, forming a plurality of three-dimensional nano-structures 113 on a surface of the semiconductor layer 110;

S34, growing an active layer 120 and a second semiconductor layer 130 on the surface of three-dimensional nano-structures 113;

S35, removing the substrate to expose a surface of the first semiconductor layer 110;

S36, forming a plurality of three-dimensional nanostructures 115 on the exposed surface of the first semiconductor layer 110;

S37, applying a first electrode 112 electrically connected to and covers the exposed surface of the first semiconductor layer 110; and S38, applying a second electrode 132 electrically connected to the second semiconductor layer 130.

Photons reaching the plurality of three-dimensional nano-structures 115 with a large incident angle can be reflected, changing the motion direction of the photons so that these photons can be extracted from the light emitting surface. Furthermore, because the three-dimensional nano-structure 115 is M-shaped, the three-dimensional nano-structures 115 can function as two layer of three-dimensional nano-structure assembled together, and the light extraction efficiency of the LED 30 will be improved.

Figure 9:
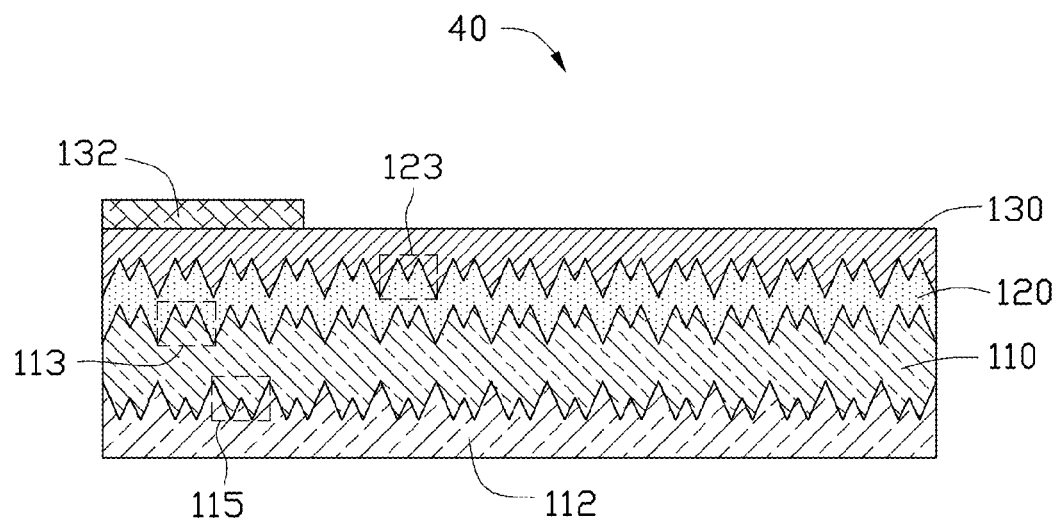
FIG. 9 shows a schematic view of another embodiment of an LED.

Referring to FIG. 9, another embodiment of an LED 40 includes a first semiconductor layer 110, an active layer 120, a second semiconductor layer 130, a first electrode 112, and a second electrode 132. The first semiconductor layer 110 includes a first surface and the second surface opposite to the first surface. The active layer 120 and the second semiconductor layer 130 are stacked on the second surface of the first semiconductor layer 110 in that order. A surface of the second semiconductor layer 120 away from the active layer 120 is configured as the light emitting surface of LED 40. The first surface of the first semiconductor layer 110 defines a plurality of three-dimensional nano-structures 115. The second surface of the first semiconductor layer 110 defines a plurality of three-dimensional nano-structures 113. The surface of the active layer 120 away from the first semiconductor layer 110 defines a plurality of three-dimensional nano-structures 123. The first electrode 112 is electrically connected with and covers the first surface of the first semiconductor layer 110, and the second electrode 132 is electrically connected with the second semiconductor layer 130. The structure of the LED 40 is similar to that of the LED 30, but further includes the plurality of three-dimensional nano-structures 123 located on the surface of the active layer 120 away from the first semiconductor 110.

The three-dimensional nano-structure 123 is similar to the three-dimensional nano-structures 113. The distribution and alignment of the three-dimensional nano-structures 123 is the same as that of the three-dimensional nano-structures 113.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A light emitting diode, comprising:
a first semiconductor layer having a first surface and a second surface opposite to the first surface;
an active layer stacked on the second surface of the first semiconductor layer;
a second semiconductor layer stacked on the active layer;
a first electrode electrically connected with and covering the first surface of the first semiconductor layer;
a second electrode electrically connected with the second semiconductor layer; and
a plurality of three-dimensional nano-structures located on the second surface of the first semiconductor layer and on the light emitting surface, wherein each of the plurality of three-dimensional nano-structures has a first peak and a second peak aligned side by side, a first groove is defined between the first peak and the second peak, a second groove is defined between each two adjacent three-dimensional nano-structures of the plurality of three-dimensional nano-structures, and a depth of the first groove is less than a depth of the second groove.

2. The light emitting diode of claim 1, wherein the each of the plurality of three-dimensional nano-structures is a bar-shaped protruding structure extending along a straight line, a curve line, or a polygonal line.

3. The light emitting diode of claim 1, wherein a cross-section of the each of the three-dimensional nano-structure is M-shaped.

4. The light emitting diode of claim 1, wherein a surface of the active layer is engaged with the plurality of three-dimensional nano-structures located on the first semiconductor layer.

5. The light emitting diode of claim 1, wherein the depth of the first groove ranges from about 30 nanometers to about 120 nanometers, and the depth of the second groove ranges from about 100 nanometers to about 200 nanometers.

6. The light emitting diode of claim 1, wherein the plurality of three-dimensional nano-structures is aligned side by side and extends to form a plurality of concentric circles or concentric rectangles.

7. The light emitting diode of claim 1, wherein the plurality of the three-dimensional nano-structures are periodically aligned, and a period of the plurality of the three-dimensional nano-structures ranges from about 100 nanometers to about 500 nanometers.

8. The light emitting diode of claim 1, wherein a distance between the each two adjacent three-dimensional nano-structures ranges from about 0 nanometers to about 200 nanometers.

9. The light emitting diode of claim 1, wherein a width of the plurality of three-dimensional nano-structures ranges from about 100 nanometers to about 300 nanometers.

10. The three-dimensional nano-structure array of claim 1, wherein the first peak comprises a first surface and a second surface intersecting each other to form a first include angle, the second peak comprises a third surface and a fourth surface intersecting each other to form a second include angle, and both the first include angle and the second include angle range from about 30 degrees to about 90 degrees.

11. The light emitting diode of claim 10, wherein a cross-section of the first peak has a shape of a trapezoid or a triangle, and a cross-section of the second peak has a shape of a trapezoid or a triangle.

12. The light emitting diode of claim 10, wherein the fourth surface of the second peak intersects with the second surface of the first peak to form the first groove, and the second groove is defined by the third surface of the second peak and the first surface of the first peak of the adjacent three-dimensional nano-structure.

\* \* \* \* \*